United States Patent
Wang et al.

(10) Patent No.: US 8,274,828 B2
(45) Date of Patent: Sep. 25, 2012

(54) STRUCTURES AND METHODS FOR READING OUT NON-VOLATILE MEMORY USING REFERENCING CELLS

(75) Inventors: Lee Z. Wang, Hsinchu (TW); Shr-Tsai Huang, Hsin Chu County (TW)

(73) Assignee: FS Semiconductor Corp., Ltd., Hsinchu (TW)

( * ) Notice: Subject to any disclaimer, the term of this patent is extended or adjusted under 35 U.S.C. 154(b) by 148 days.

(21) Appl. No.: 12/969,290

(22) Filed: Dec. 15, 2010

(65) Prior Publication Data

US 2012/0155177 A1    Jun. 21, 2012

(51) Int. Cl.
   *G11C 11/34* (2006.01)
(52) U.S. Cl. .............................. 365/185.17; 365/185.24

(58) Field of Classification Search ............. 365/185.17, 365/185.24
   See application file for complete search history.

(56) References Cited

U.S. PATENT DOCUMENTS

| | | | |
|---|---|---|---|
| 2006/0291287 A1* | 12/2006 | Furnemont | 365/185.18 |
| 2007/0136529 A1* | 6/2007 | Otterstedt et al. | 711/115 |
| 2008/0279013 A1* | 11/2008 | Horch et al. | 365/185.28 |

* cited by examiner

*Primary Examiner* — Michael Tran
(74) *Attorney, Agent, or Firm* — Muncy, Geissler, Olds & Lowe, PLLC

(57) ABSTRACT

The structures and methods of reading out semiconductor Non-Volatile Memory (NVM) using referencing cells are disclosed. The new invented scheme can reduce large current consumption from the direct current biasing in the conventional scheme and achieve a high resolution on the cell threshold voltage with a good sensing speed.

37 Claims, 7 Drawing Sheets

STRUCTURES AND METHODS FOR READING OUT NON-VOLATILE MEMORY USING REFERENCING CELLS

BACKGROUND OF THE INVENTION

1. Field of the Invention

The present invention relates to an integrated circuit for sensing the stored information of a semiconductor Non-Volatile Memory (NVM). In particular, the present invention relates to circuitry and operating method of using a referencing memory cell to sense the information stored in a semiconductor NVM.

2. Description of the Related Art

Semiconductor Non-Volatile Memory (NVM), and particularly Electrically Erasable, Programmable Read-Only Memories (EEPROM), exhibit wide spread applicability in a range of electronic equipments from computers, to telecommunications hardware, to consumer appliances. EEPROM cells store datum by modulating their threshold voltages (device on/off voltage) of the Metal-Oxide-Semiconductor Field Effect Transistors (MOSFET) by the injection of charge carriers into the charge-storage layer above the channel regions of the MOSFETs. For example, an accumulation of electrons in the floating gate, or in a charge-trap dielectric layer, or nano-crystals above the transistor channel region, causes the MOSFET to exhibit a relatively high threshold voltage. The unique threshold voltage of the memory cell modulated by the stored charges can be applied to represent a state of information. When the power of the semiconductor memory cell is "off" the stored charges still remain in the memory cells. Therefore, the stored information for the correspondent threshold voltage in the memory cells is "non-volatile" even with the power "off". One class of EEPROMs, Flash EEPROM, may be regarded as specifically configured EEPROMs into cell array that may be erased only on a global or sector-by-sector basis. Flash EEPROM has the advantages of higher compact density and high programming/erase speed over the conventional EEPROM. Flash EEPROM arrays have been broadly applied to mass storage of program codes and digital datum for electronic equipments.

The conventional current-sensing scheme for reading-out the EEPROM cells using a referencing semiconductor NVM cell is shown in FIG. 1, where voltage biases are applied to control gate, source electrode, substrate electrode, and one terminal of a pull-up element 130 with the other terminal attached to the drain electrode of a read EEPROM cell $M_c$. The current flowing through the drain electrode is then amplified by a current mirror amplifier 120. An identical circuit configuration attached with a referencing cell $M_{rf}$ is also constructed. The two outputs of the pair of the symmetrical circuitries attached with a read NVM cell $M_c$ and a referencing cell $M_{rf}$ respectively are then fed into a differential voltage sense amplifier 110 for the comparison of the amplified currents. The output of the differential voltage sense amplifier 110 further pushes the voltage comparison result to a data latch buffer (not shown). The final outcome of the data latch buffer indicates that the current generated from the read NVM cell $M_c$ with the applied voltage biases is greater than the referencing current and vice versa. In one particular case for the referencing current generated from an identical referencing NVM cell $M_{rf}$ with the same applied biased to both read cell $M_c$ and referencing cell $M_{rf}$, the outcome of the data latch buffer indicates that the threshold voltage of the read cell $M_c$ with less cell current is higher than that of the referencing cell $M_{rf}$ and vice versa. Therefore, with the same biases to the identical read and reference cells, the sensing scheme is basically to compare the cells' threshold voltages between the read cell $M_c$ and the referencing cell $M_{rf}$. Since the mismatch between the symmetrical circuitries and memory cells from manufacturing non-uniformity causes the ambiguity of cells' threshold voltages, in practice, a cell threshold voltage guard band between the read and referencing cell has to take into account to separate the ambiguity. This cell threshold voltage guard band imposes a limitation on the numbers of states represented by the threshold voltages of NVM cells in the multi-bit per cell storage application.

One disadvantage for the conventional current-sense scheme is that the cell currents for both cells require being "on" and amplified by the current mirror amplifiers 120 to maintain steady state voltage potentials at the two inputs of the differential voltage sense amplifier 110. Due to the direct current paths from the pull-up elements 130 to NVM cells and, mostly from the amplified mirrored currents, the power consumption for the sense scheme is high. In practice, the high current consumption in the sensing circuitry imposes a key limitation factor of having a large number of NVM cells parallel read in semiconductor NVM circuit design.

In this invention, we have proposed a new kind of semiconductor NVM reading-out scheme using a referencing cell. The new scheme can resolve the threshold voltage difference between the read cell and the referencing cell to a very good accuracy with a proper sensing speed. In particular, the new scheme has no direct current paths in the circuitry but only the switching currents during the sensing period resulting in a small current consumption reading.

SUMMARY OF THE INVENTION

FIG. 2 shows the circuit schematic for the proposed sensing scheme. The source electrode and drain electrode of a read NVM cell $M_c$ are connected to the ground and one terminal of an equivalent loaded capacitor $C_c$ with the other terminal to the ground, respectively. The total capacitance of the equivalent capacitor $C_c$ consists of the capacitance of an adjustment capacitor, bit line capacitances, and other remaining parasitic capacitances. Symmetrically, the source electrode and drain electrode of a reference NVM cell $M_{rf}$ are connected to the ground and one terminal of another equivalent loaded capacitor $C_{rf}$ with the other terminal to the ground, respectively. The total capacitance of the equivalent capacitor $C_{rf}$ includes the capacitance from the other adjustment capacitor, bit line capacitances, and other remaining parasitic capacitances. Both the capacitances of the equivalent capacitors $C_c$ and $C_{rf}$ are matched to a capacitance value $C_L$ within a fair tolerance by adjusting the adjustment capacitors in the read line and referencing line, respectively. The terminals X and Y between the read NVM drain electrode and the equivalent loaded capacitor $C_c$, and the referencing NVM drain electrodes and the equivalent loaded capacitor $C_{rf}$ are connected to electrical switches $Q_1$ and $Q_2$, respectively for charging the two equivalent loaded capacitors $C_c$ and $C_{rf}$ to a preset voltage, $V_R$. Meanwhile, the two terminals X and Y are also connected to two input terminals $V_{iL}$ and $V_{iR}$ of the differential voltage sense amplifier 210 shown in FIG. 3.

The circuit schematic of the differential voltage sense amplifier 210 is shown in FIG. 3. The differential voltage sense amplifier 210 is constructed by four P-type MOSFETs and seven N-type MOSFETs. MP1, MP2, MN1, MN2, and MN3 are the mirrored symmetry of MP3, MP4, MN4, MN5, and MN6 as depicted in FIG. 3. The two input terminals $V_{iL}$ and $V_{iR}$ are the gates of MN2 and MN5. The output node OUT and output reverse node OUTB are the two terminals of the symmetrical differential pair located at the drain electrodes of the P-type MOSFETs and the drain electrodes of MN1 and MN4, respectively. The gates of MP1, MP3, and MN7 are connected to an enabled signal SAEnb. When the enabled signal SAEnb is at "low" state, the voltage sense amplifier 210 is disabled. MP1 and MP3 are turned on to charge both the output nodes, OUT and OUTB to maintain the "high" state with a voltage potential, $V_{DD}$, while MN7 is "off" to cut the current paths to the ground. When the enable signal SAEnb goes to "high", MP1 and MP3 are "off" and MN7 is "on". The two output nodes (OUT and OUTB) begin to discharge to the ground. Since the differential voltage sense amplifier 210 is constructed as symmetrical as possible, the small voltage difference at the two voltage input nodes of the gates of MN2 and MN5 can break the balance of the symmetrical current paths of the left-right portions of the circuitries. The asymmetrical currents are further amplified through the positive feedback of the latch of MP2/MN1/MN3 and MP4/MN4/MN6. The output nodes, OUT and OUTB, are then latched to "high" and "low" states, respectively, and vice versa.

FIG. 4 shows the operation sequence for the invented sense scheme. The voltage potentials $V_{iL}$ and $V_{iR}$ at the two capacitor nodes are illustrated in the top drawing of FIG. 4. Initially with the selected read NVM cell $M_c$ and referencing NVM cell $M_{rf}$ deactivated, the two capacitor nodes ($V_{iL}$ and $V_{iR}$) are charged to a preset voltage $V_{iR}$ through switches $Q_1$ and $Q_2$ (turned "ON" by a control signal CS) respectively for a charging time $T_c$. When the gates of the selected read cell $M_c$ and referencing cell $M_{rf}$ are activated by applying voltage biases $V_{gs}$ after the pre-charging, the two capacitors ($C_c$ and $C_{rf}$) begin to discharge through the read NVM cell $M_c$ and referencing NVM cell $M_{rf}$ respectively for an elapsing time $T_e$. Depending on the applied gate voltage $V_{gs}$ to the cell's threshold voltage $V_{th}$, the voltage potentials, $V_{iL}$ and $V_{iR}$ at the capacitor nodes drop according to their discharge rates. As illustrated at the top drawing of FIG. 4, the dotted line (i) represents the voltage potential ($V_{iL}$ or $V_{iR}$) at the capacitor node with an applied gate voltage bias smaller than the cell's threshold voltage, $V_{gs} < V_{th}$; the dashed line (ii) represents the voltage potential ($V_{iL}$ or $V_{iR}$) at the capacitor node with an applied gate voltage bias equal to the cell's threshold voltage, $V_{gs} = V_{th}$; the solid line (iii) represents the voltage potential ($V_{iL}$ or $V_{iR}$) at the capacitor node with an applied gate voltage bias larger than the cell's threshold voltage, $V_{gs} > V_{th}$. When the differential sense amplifier 210 is enabled after the elapsing time $T_e$, the differential voltage sense amplifier 210 senses the voltage difference between $V_{iL}$ and $V_{iR}$, and latches to a "high/low" state or a "low/high" state. Since the larger NVM gate voltage $V_{gs}$ to the cell's threshold voltage $V_{th}$ is applied, the faster the discharge rate is and the faster the voltage potential ($V_{iL}$ or $V_{iR}$) at the capacitor node drops. Therefore with the same gate voltage bias $V_{gs}$ applied to the gates of the read cell $M_c$ and the referencing cells $M_{rf}$, the output node OUT of the differential voltage amplifier 210 (FIG. 3) are latched to a "low" state for the read cell's threshold voltage higher than that of the referencing cell $M_{rf}$, and vice versa.

For the illustrated case in FIG. 4, the applied gate voltage and threshold voltage of the reference cell $M_{rf}$ is set to be $V_{gs} = V_{thrf}$. Throughout the specification and drawings, $V_{thc}$ and $V_{thrf}$ denote the threshold voltages of the read cell $M_c$ and the referencing cells $M_{rf}$ respectively. Thus, the output nodes, OUT illustrated at the bottom drawing of FIG. 4, are latched to the "low" state and the "high" state for $V_{gs} < V_{thc}$ (dashed line) and $V_{gs} > V_{thc}$ (solid line) respectively during the sensing time $T_s$. When the differential voltage sense amplifier 210 is disabled after the sensing time $T_s$, the output node OUT and its reverse node OUTB are both charged back to the "high" state and ready for the next sensing.

The present invention is better understood upon consideration of the detailed description below, in conjunction with the drawings.

BRIEF DESCRIPTION OF THE DRAWINGS

For a better understanding of the present invention and to show how it may be carried into effect, reference is now made to the following drawings, which show the preferred embodiments of the present invention, in which.

DETAILED DESCRIPTION OF THE INVENTION

The following detailed description is meant to be illustrative only and not limiting. It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents. Those of ordinary skill in the art will immediately realize that the embodiments of the present invention described herein in the context of methods and schematics are illustrative only and are not intended to be in any way limiting. Other embodiments of the present invention will readily suggest themselves to such skilled persons having the benefits of this disclosure.

Figure 6:
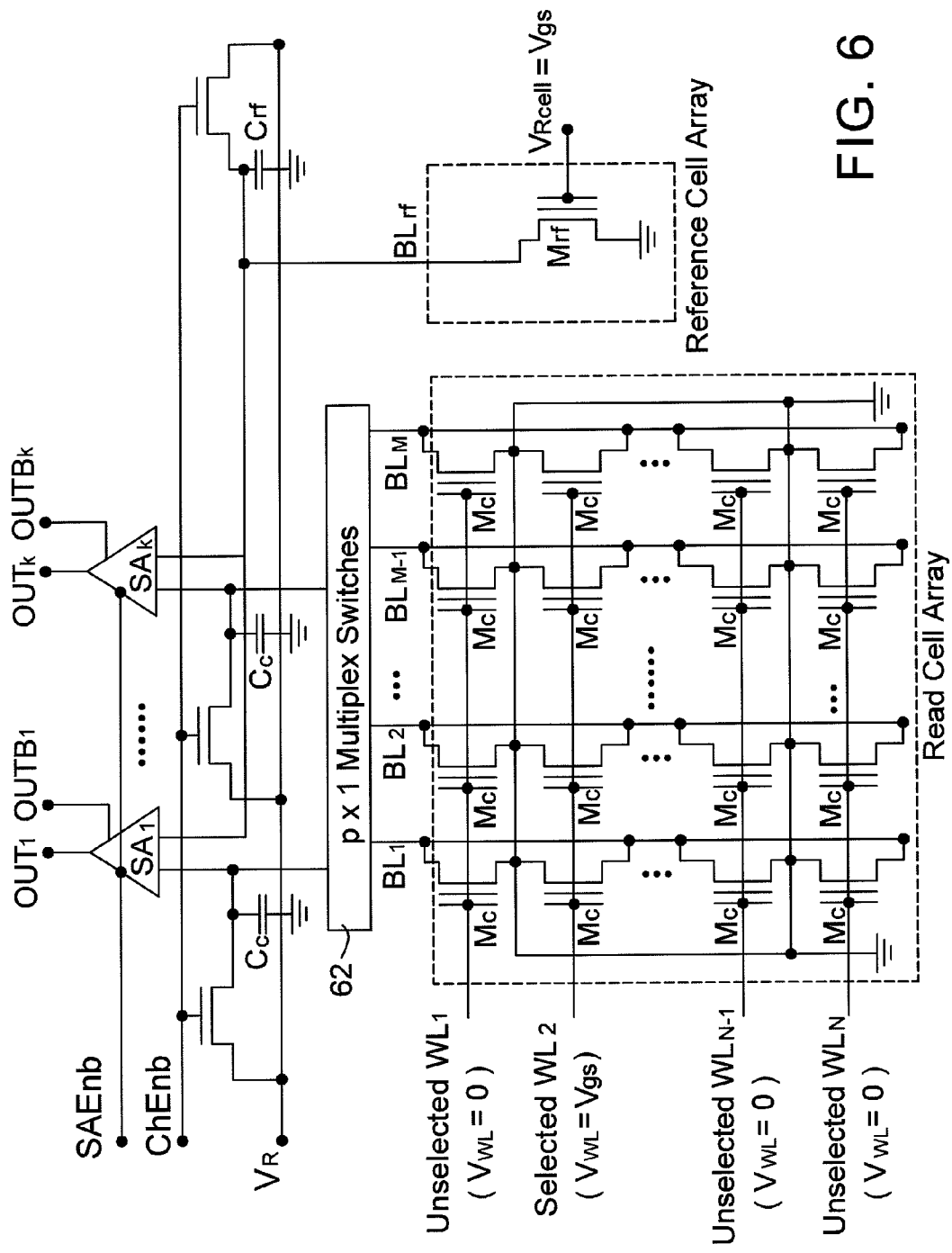
FIG. 6 shows circuit schematic for a NOR-type flash EEPROM array in accordance with one embodiment of the present invention.

FIG. 6 shows the circuit schematic for a NOR-type flash EEPROM array in accordance with one embodiment of the present invention. The memory cell array in the NOR flash array is organized as the followings: The gates of a row of "M" memory cells $M_c$ form a single word line. The source electrodes of NVM cells $M_c$ are connected to a common ground horizontally and the drain electrodes of a column of "N" NVM cells $M_c$ are connected to a single bit line. Through "p×1" multiplex switches 62, each bit line is connected to one terminal of each of "k" differential voltage sense amplifiers $SA_1$-$SA_k$. Meanwhile, the total capacitances of the equivalent loaded capacitors $C_c$ and $C_{rf}$ on the two input nodes of the differential voltage sense amplifier ($SA_1$-$SA_k$) including adjusted capacitances, bit line capacitances and parasitic capacitances are matched to a capacitance value of $C_L$ by adding two independent adjustment capacitors (not shown) in the read cell circuit path and reference cell circuit path, respectively. In the embodiment, the capacitance of each equivalent loaded capacitors, $C_c$ and $C_{rf}$, in a 128 Mega-bit NOR flash array is designed to be about 300 fF ($300 \times 10^{-15}$ Farad).

Figure 1:
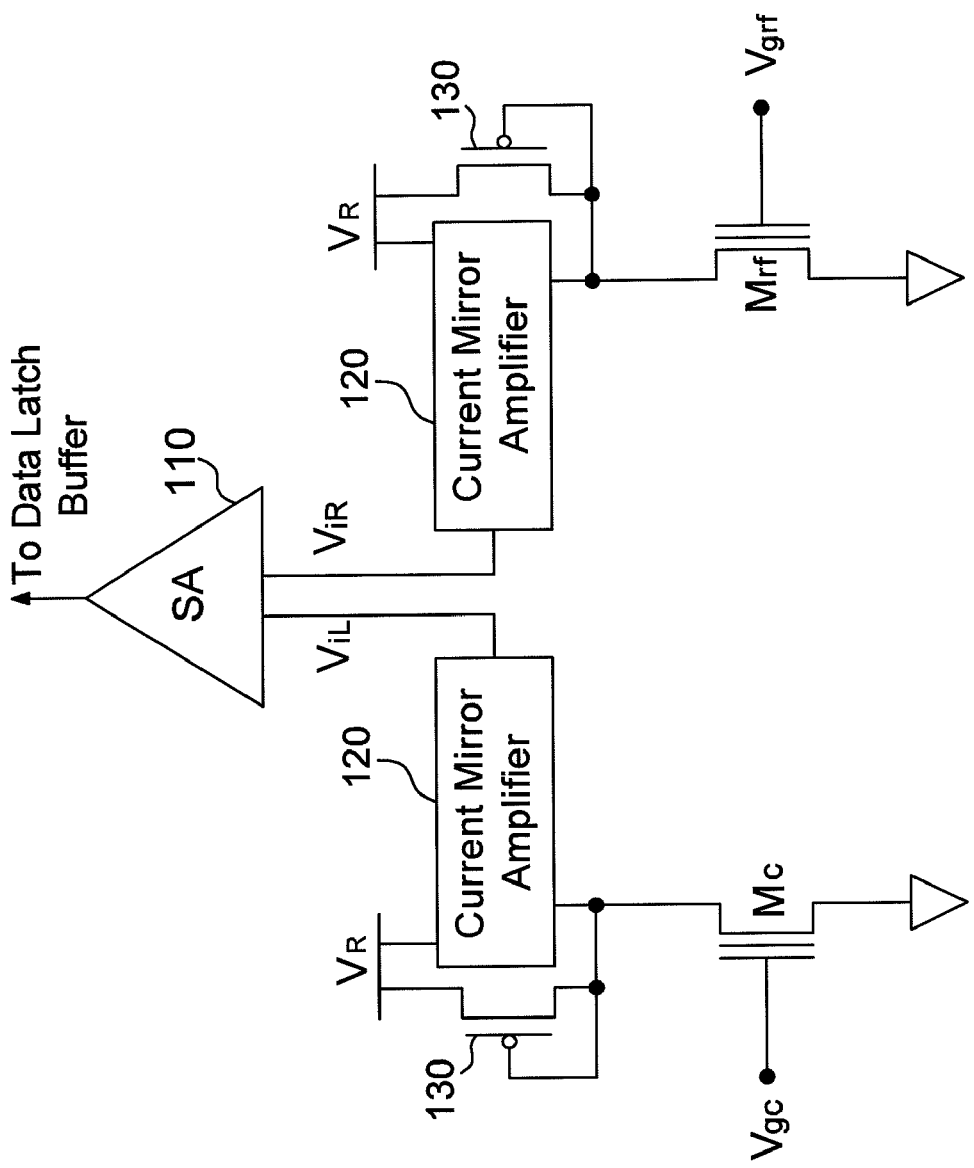
FIG. 1 shows the conventional current-sensing scheme for reading-out the EEPROM cells using a referencing NVM cell.
Figure 2:
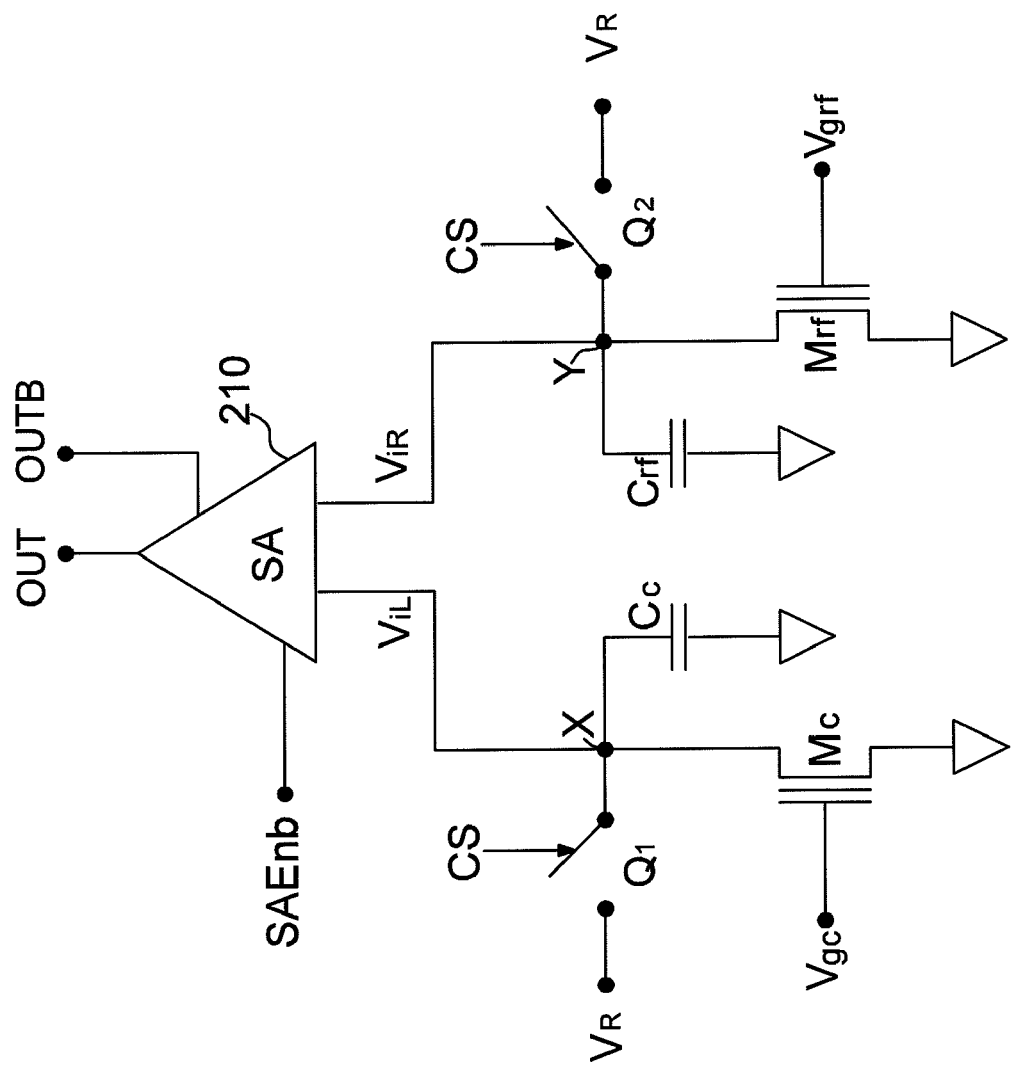
FIG. 2 shows the circuit schematic for the invented sensing scheme using a referencing cell.
Figure 3:
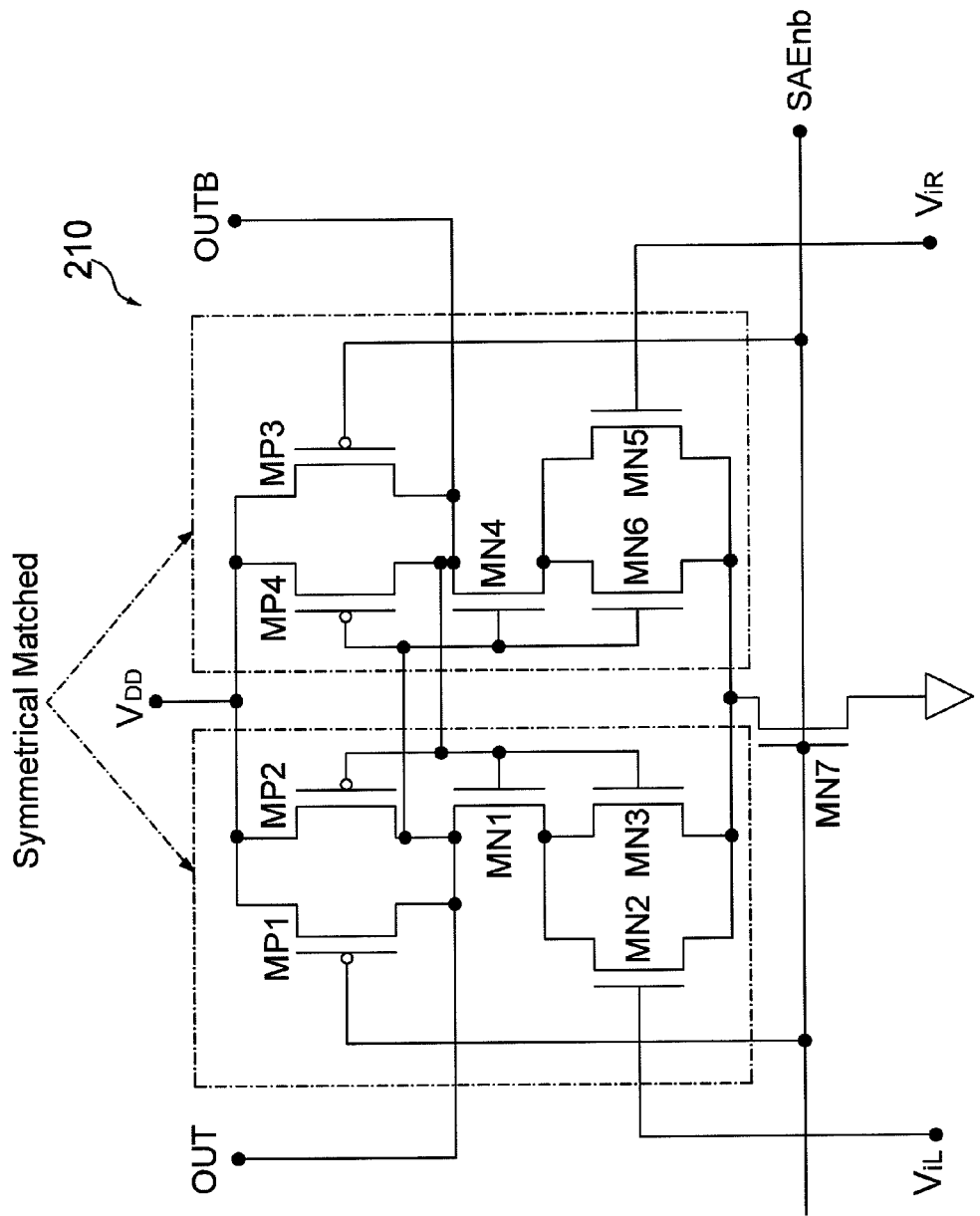
FIG. 3 shows the circuit schematic of the differential voltage sense amplifier for this invention.
Figure 4:
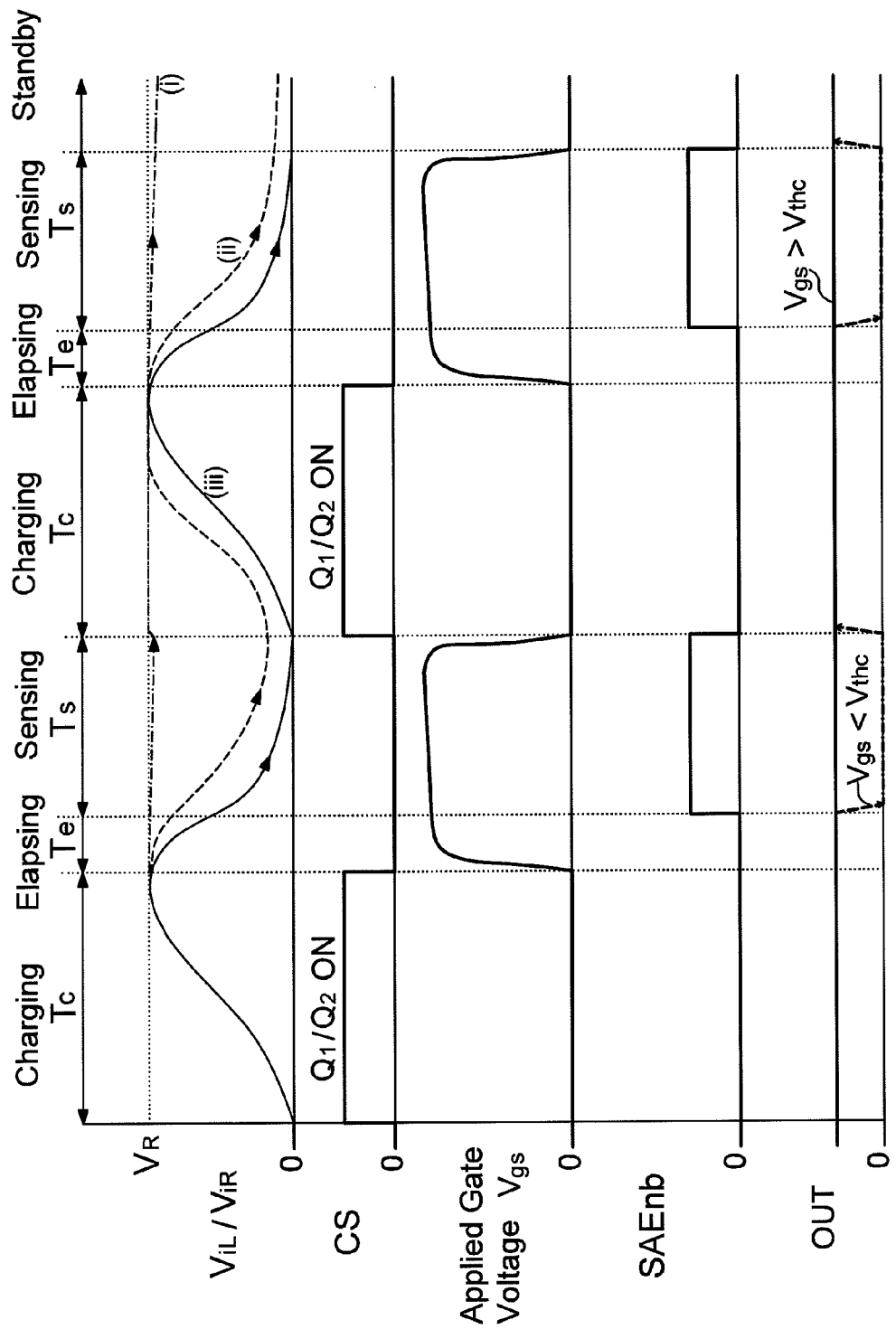
FIG. 4 shows operation sequence for the invented sensing scheme in three time stages: (1) Charging, (2) Elapsing, and (3) Sensing, and illustrates the voltage potentials at the capacitor node for (a) a read NVM cell with a threshold voltage equal to an applied gate voltage (dashed line (ii)) (b) a read NVM cell with higher threshold voltage (dotted line (i)), and (c) a read NVM cell with lower threshold voltage (solid line (iii)).

When a "read" command and an address of memory cells are given from the control circuitry, the selected bit lines correspondent to the memory cell address and the reference bit line are pre-charged to a "read voltage" $V_R \cong 1.2$ V for 10 nano-seconds. A gate voltage $V_{gs}$ is applied to both the selected word line of the correspondent memory address and the gate of the reference cell $M_{rf}$. The selected bit lines, the reference bit line and their attached nodes begin to discharge through the read NVM cells $M_c$ and the reference cell $M_{rf}$, respectively. After an elapsing time $T_e \cong 10$ nano-seconds, the differential voltage sense amplifiers ($SA_1$-$SA_k$) are enabled. The voltage level differences relative to that of the reference cell at the two input terminals of each differential voltage sense amplifier ($SA_1$-$SA_k$) are sensed and latched to a "low" state or a "high" state accordingly during the sensing time, $T_s \cong 20$ nano-seconds. Therefore the parallel sensing of "k" NVM cells is achieved. After the sensing time, the entire differential voltage sense amplifiers ($SA_1$-$SA_k$) are disabled and charged back to their standby state for the next sensing. It is noted that each differential voltage sense amplifier in FIGS. 6 and 7 has the same circuit configuration as that shown in FIG. 3.

Figure 5:
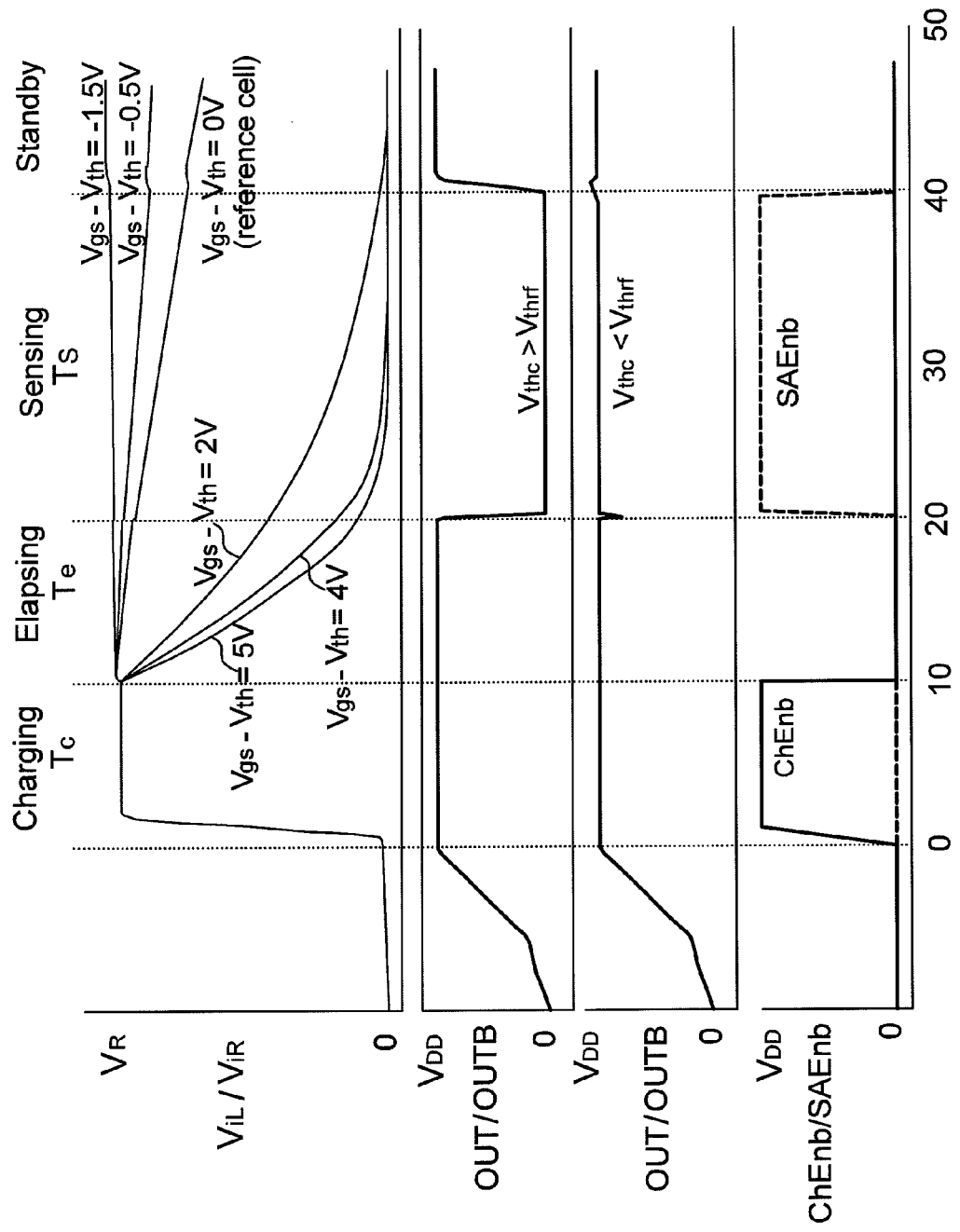
FIG. 5 show an embodiment of the simulation results for the voltage potentials at the two capacitor nodes for the various ($V_{gs}$-$V_{th}$)s and the correspondent voltage outputs at the terminal OUT in comparison with the referencing cell with the condition of ($V_{gs}$-$V_{thrf}$=0).

FIG. 5 has shown the simulation results for the operation sequence according to the embodiment of FIG. 6. The threshold voltage of the reference cell is programmed to be the same as the applied gate voltage, i.e., $V_{gs} = V_{thrf}$. It can be easily seen in the middle of FIG. 5 that if the threshold voltages of NVM cells are greater than that of the reference cell (i.e., $V_{thc} > V_{thrf}$), the sense amplifier output OUT, is latched to a "low" state. For the "lower" threshold voltages of NVM cells (i.e., $V_{thc} < V_{thrf}$), the sense amplifier output OUT is latched to a "high" state during the sensing period. In standby mode, the output terminals, OUT and OUTB, of each differential voltage sense amplifier ($SA_1$-$SA_k$) both return to the "high" state as shown in the middle of FIG. 5.

Figure 7:
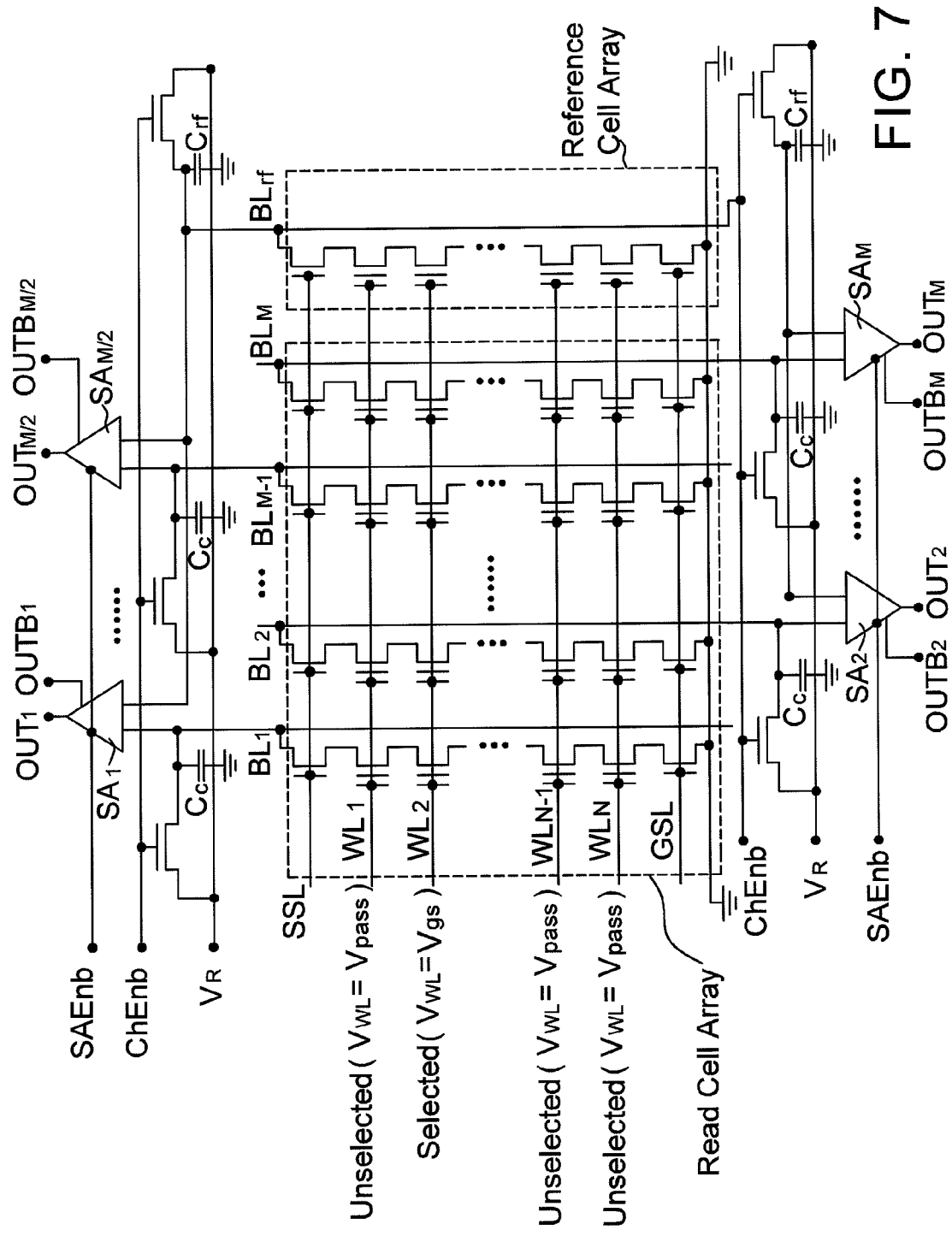
FIG. 7 shows the circuit schematic for a NAND-type flash EEPROM array in accordance with another embodiment of the present invention.

One embodiment for using the present invention in an NAND flash array is illustrated in FIG. 7. The NAND flash array consists of multiple semiconductor NVM cell strings, where the "N" NVM cells are connected in series in a single NAND string. Each NAND string is through an SSL transistor connected to an individual bit line attached with one of the sense amplifiers ($SA_1$-$SA_M$). The two MOSFET SSL and GSL in the NAND string are the two switches to access the shared bit line and the ground line, respectively. In a typical NAND array, there are "M" units of sense amplifiers ($SA_1$-$SA_M$). As illustrated in FIG. 7, the sense amplifiers ($SA_1$-$SA_M$) are arranged to the "top" for the "odd" bit lines and the "bottom" for the "even" bit lines. The referencing NAND string is constructed as the same manner of the read NAND string. The loaded capacitances of equivalent capacitors, $C_c$ and $C_{rf}$, for the read string and the reference string are matched to a pre-determined capacitance value of $C_L$ within a fair tolerance by adding two adjusted capacitors in the read cell line and referencing line, respectively.

When a "read" command and an address of memory cells are given from the control circuitry, the selected NAND string is attached to the selected bit line and the ground line by activating SSL and GSL, respectively. The unselected word lines in the NAND string are applied with voltage bias $V_{pass}$ to pass the voltage biases to the source electrode and drain electrode of the selected NVM cell in the NAND string. The referencing NAND string is also applied with the same bias condition as the read NAND string. While the selected read word line and reference word line are deactivated with a low voltage (i.e., low enough to turn off the selected NVM cells and the selected reference cell), the selected bit lines and reference bit line are pre-charged to a "read voltage" $V_R$. After the bit lines charging, a gate voltage $V_{gs}$ is applied to both the selected read word line and reference word line. The selected read bit lines and reference bit line at their attached nodes begin to discharge through the selected read NVM cells and the selected reference cell, respectively. After an elapsing time, the sense amplifiers ($SA_1$-$SA_M$) are enabled. The sense amplifier output, OUT, is latched to a "low" state for the threshold voltages of NVM cells are greater than that of the reference cell (i.e., $V_{thc} > V_{thrf}$). The sense amplifier output, OUT, is latched to a "high" state for the "lower" threshold voltages of NVM cells (i.e., $V_{thc} < V_{thrf}$). The voltage level differences relative to that of the reference cell at the input terminals of each differential voltage sense amplifiers ($SA_1$-$SA_M$) are sensed and latched to a "low" state or a "high" state accordingly during the sensing time. Therefore, the parallel sensing of multiple NVM cells is achieved. After the sensing time, the entire differential voltage sense amplifiers ($SA_1$-$SA_M$) are disabled and charged back to their standby state for the next sensing.

The above read circuitries and method of sensing are valid for any kind of semiconductor NVM cells. By using the various circuitries based on the configuration and the operational waveforms or different types of semiconductor NVM cells, those skilled in the art would realize that the embodiments of the present invention described herein are illustrative only and are not in any way limiting. Other embodiments of this invention will be obvious to those skilled in the art in view of this description.

What is claimed is:

1. A data reading device comprising:
    a sense amplifier for sensing a voltage difference between a first input terminal and a second input terminal of the sense amplifier;
    a first capacitor and a second capacitor connected to the first input terminal and the second input terminal for respectively charging the first input terminal and the second input terminal to a preset voltage; and
    a read nonvolatile memory (NVM) cell and a reference NVM cell connected to the first input terminal and the second input terminal respectively;
    wherein when a control gate of the read NVM cell and a control gate of the reference NVM cell are biased with a gate voltage, the first capacitor and the second capacitor are discharged through the read NVM cell and the reference NVM cell; and
    wherein capacitances of the first capacitor and the second capacitor are substantially equivalent.

2. The device according to claim 1, wherein the read NVM cell and the reference NVM cell are the same type of NVM cells.

3. The device according to claim 1, wherein each of the first capacitor and the second capacitor has a first terminal and a second terminal and the second terminals of the first capacitor and the second capacitor are connected to a ground; and wherein the first terminal of the first capacitor is connected to both a drain of the read NVM cell and the first input terminal and the first terminal of the second capacitor is connected to both a drain of the reference NVM cell and the second input terminal.

4. The device according to claim 1, wherein each capacitance of the first capacitor and the second capacitor comprises at least one of capacitance of an adjustment capacitor, a bit line capacitance and a parasitic capacitance.

5. The device according to claim 1, further comprising:
a first switch for connecting the first capacitor to the preset voltage in response to a control signal; and
a second switch for connecting the second capacitor to the preset voltage in response to the control signal.

6. The device according to claim 1, wherein the sense amplifier comprises:
a first P-channel transistor having a first source connected to an operating voltage, a first gate receiving an enable signal and a first drain generating a first output voltage;
a second P-channel transistor having a second source connected to the operating voltage, a second gate generating a second output voltage and a second drain connected to the first drain;
a first N-channel transistor having a third drain connected to the second drain and a third gate connected to the second gate;
a second N-channel transistor having a fourth drain connected to a third source of the first N-channel transistor and a fourth gate defined as the first input terminal;
a third N-channel transistor having a fifth drain connected to the third source, a fifth gate connected to the third gate and a fifth source connected to a fourth source of the second N-channel transistor;
a third P-channel transistor having a sixth source connected to the operating voltage, a sixth gate receiving the enable signal and a sixth drain connected to the second gate;
a fourth P-channel transistor having a seventh source connected to the operating voltage, a seventh gate connected to the second drain and a seventh drain connected to the sixth drain and the second gate;
a fourth N-channel transistor having an eighth drain connected to the seventh drain and an eighth gate connected to the seventh gate;
a fifth N-channel transistor having a ninth drain connected to an eighth source of the fourth N-channel transistor and a ninth gate defined as the second input terminal;
a sixth N-channel transistor having a tenth drain connected to the ninth drain, a tenth gate connected to the eighth gate and a tenth source connected to a ninth source of the fifth N-channel transistor and the fifth source; and
a seventh N-channel transistor having an eleventh drain connected to the tenth source, an eleventh gate receiving the enabled signal and a eleventh source connected to a ground.

7. The device according to claim 6, wherein when the enable signal is at logic 1, the two output voltages are complementary.

8. The device according to claim 7, wherein when the enable signal is at logic 1 and a voltage level at the first input terminal is greater than a voltage level at the second input terminal, the first output voltage is at logic 0 and the second output voltage is at logic 1; and wherein when the enable signal is enabled and the voltage level at the first input terminal is less than the voltage level at the second input terminal, the first output voltage is at logic 1 and the second output voltage is at logic 0.

9. The device according to claim 6, wherein when the enable signal is at logic 0, the two output voltages are at logic 1.

10. A method of reading a nonvolatile memory (NVM) cell comprising the steps of:
applying a pre-charge voltage to a first capacitor and a second capacitor during a charge period, wherein the NVM cell is connected in parallel with the first capacitor and a reference NVM cell is connected in parallel with the second capacitor;
applying a gate voltage to a control gate of the NVM cell and a control gate of the reference NVM cell to discharge the first capacitor and the second capacitor through the NVM cell and the reference NVM cell during an elapsing period and a sensing period; and
sensing a difference between a first voltage level across the first capacitor and a second voltage level across the second capacitor during the sensing period;
wherein capacitances of the first capacitor and the second capacitor are substantially equivalent.

11. The method according to claim 10, wherein the NVM cell and the reference NVM cell are the same type of NVM cells.

12. The method according to claim 10, wherein each capacitance of the first capacitor and the second capacitor comprises at least one of capacitance of an adjustment capacitor, a bit line capacitance and a parasitic capacitance.

13. The method according to claim 10, wherein a result of sensing indicates whether a threshold voltage of the NVM cell is greater than a threshold voltage of the reference NVM cell.

14. The method according to claim 10, wherein when a threshold voltage of the NVM cell is greater than a threshold voltage of the reference NVM cell, the second capacitor is discharged faster than the first capacitor during the elapsing period and the sensing period.

15. The method according to claim 10, wherein the first voltage level is related to a voltage difference between the gate voltage and a threshold voltage of the NVM cell and the second voltage level is related to a voltage difference between the gate voltage and a threshold voltage of the reference NVM cell.

16. The method according to claim 10, wherein each of the first capacitor and the second capacitor has both a first terminal and a second terminal and the second terminals of the first capacitor and the second capacitor are connected to a ground; and wherein the first terminal of the first capacitor is connected to a drain of the NVM cell and the first terminal of the second capacitor is connected to a drain of the reference NVM cell.

17. A NOR nonvolatile memory (NVM) device, comprising:
a plurality of NVM cells arranged in rows and columns in NOR configuration;
a reference cell connected to a reference bit line;
a plurality of first capacitors;
a second capacitor;
a plurality of bit lines each connected to a specified number of the NVM cells; and
a plurality of sense amplifiers each having a first input terminal connected to both one of the first capacitors and one of at least one selected bit line and a second input terminal connected to both the second capacitor and the reference bit line;

wherein each of the first capacitors is configured to charge a corresponding selected bit line to a read voltage and the second capacitor is configured to charge the reference bit line to the read voltage;

wherein when a control gate of the reference cell and a selected word line are biased with a gate voltage, the reference bit line and each selected bit line are discharged through the reference cell and each corresponding selected NVM cell; and wherein capacitances of the first capacitors and the second capacitor are substantially equivalent.

18. The device according to claim 17, wherein each capacitance of the first capacitors and the second capacitor comprises at least one of capacitance of an adjustment capacitor, a bit line capacitance and a parasitic capacitance.

19. The device according to claim 17, wherein the NVM cells and the reference cell are the same type of NVM cells.

20. The device according to claim 17, wherein a selected NVM cell is connected in parallel with the first capacitor for each selected bit line and the reference cell is connected in parallel with the second capacitor.

21. The device according to claim 20, wherein each of the first capacitors and the second capacitor has a first terminal and a second terminal and the second terminals of each first capacitor and the second capacitor are connected to a ground; and wherein the first terminal of the first capacitor is connected to both a drain of the selected NVM cell and the first input terminal for each selected bit line and the first terminal of the second capacitor is connected to both a drain of the selected reference cell and the second input terminal.

22. The device according to claim 17, wherein each of the sense amplifiers comprises:
a first P-channel transistor having a first source connected to an operating voltage, a first gate receiving an enable signal and a first drain generating a first output voltage;
a second P-channel transistor having a second source connected to the operating voltage, a second gate generating a second output voltage and a second drain connected to the first drain;
a first N-channel transistor having a third drain connected to the second drain and a third gate connected to the second gate;
a second N-channel transistor having a fourth drain connected to a third source of the first N-channel transistor and a fourth gate defined as the first input terminal;
a third N-channel transistor having a fifth drain connected to the third source, a fifth gate connected to the third gate and a fifth source connected to a fourth source of the second N-channel transistor;
a third P-channel transistor having a sixth source connected to the operating voltage, a sixth gate receiving the enable signal and a sixth drain connected to the second gate;
a fourth P-channel transistor having a seventh source connected to the operating voltage, a seventh gate connected to the second drain and a seventh drain connected to the sixth drain and the second gate;
a fourth N-channel transistor having an eighth drain connected to the seventh drain and an eighth gate connected to the seventh gate;
a fifth N-channel transistor having a ninth drain connected to an eighth source of the fourth N-channel transistor and a ninth gate driven defined as the second input terminal;
a sixth N-channel transistor having a tenth drain connected to the ninth drain, a tenth gate connected to the eighth gate and a tenth source connected to a ninth source of the fifth N-channel transistor and the fifth source; and
a seventh N-channel transistor having an eleventh drain connected to the tenth source, an eleventh gate receiving the enabled signal and a eleventh source connected to a ground.

23. A method of reading a NOR nonvolatile memory device having a plurality of NVM cells arranged in rows and columns in NOR configuration, a reference cell and a plurality of sense amplifiers, each of the sense amplifiers having a first input terminal connected to both one of a plurality of first capacitors and a corresponding selected bit line and a second input terminal connected to both a second capacitor and a reference bit line, the method comprising the steps of:
applying a read voltage to both the first capacitor of each selected bit line and the second capacitor in order to pre-charge each selected bit line and the reference bit line to a preset voltage during a charge period;
applying a gate voltage to both a control gate of the reference cell and a selected word line to discharge the reference bit line and each corresponding selected bit line through the reference cell and each corresponding selected NVM cell during an elapsing period and a sensing period; and
sensing a voltage difference between the reference bit line and the corresponding selected bit line by means of each of the sense amplifiers during the sensing period;
wherein capacitances of the first capacitors and the second capacitor are substantially equivalent.

24. The method according to claim 23, wherein the NVM cells and the reference cell are the same type of NVM cells.

25. The method according to claim 23, wherein a result of sensing indicates whether a threshold voltage of a selected NVM cell of the corresponding selected bit line is greater than a threshold voltage of the reference cell.

26. The method according to claim 23, wherein when a threshold voltage of a selected NVM cell of the corresponding selected bit line is greater than a threshold voltage of the reference cell, the second capacitor is discharged faster than the first capacitor of the corresponding selected bit line during the elapsing period and the sensing period.

27. The method according to claim 23, wherein a selected NVM cell is connected in parallel with the first capacitor for each selected bit line and the reference cell is connected in parallel with the second capacitor.

28. A NAND nonvolatile memory (NVM) device, comprising:
a NAND memory array having a plurality of NAND strings arranged therein, each NAND string having a plurality of NVM cells connected in series;
a reference NAND string having a plurality of reference cells connected in series, the reference NAND string being connected to a reference bit line;
a plurality of first capacitors;
a second capacitor;
a plurality of bit lines each connected to one of the NAND strings; and
a plurality of sense amplifiers each having a first input terminal connected to both one of the first capacitors and a corresponding bit line and a second input terminal connected to both the second capacitor and the reference bit line;
wherein each of the first capacitors is configured to charge the corresponding bit line to a read voltage and the second capacitor is configured to charge the reference bit line to the read voltage;

wherein when a selected word line is biased with a gate voltage, the reference bit line and each bit line are discharged through the reference cell and each corresponding selected NVM cell; and wherein capacitances of the first capacitors and the second capacitor are substantially equivalent.

29. The device according to claim 28, wherein each capacitance of the first capacitors and the second capacitor comprises at least one of capacitance of an adjustment capacitor, a bit line capacitance and a parasitic capacitance.

30. The device according to claim 28, wherein the NVM cells and the reference cells are the same type of NVM cells.

31. The device according to claim 28, wherein each of the first capacitors and the second capacitor has a first terminal and a second terminal and the second terminals of each first capacitor and the second capacitor are connected to a ground; and wherein the first terminal of the first capacitor is connected to the corresponding bit line coupled with both the selected NVM cell string and the first input terminal and the first terminal of the second capacitor is connected to the reference bit line coupled with both the reference cell string and the second input terminal for each of the sense amplifiers.

32. The device according to claim 28, wherein each of the sense amplifier comprises:

a first P-channel transistor having a first source connected to an operating voltage, a first gate receiving an enable signal and a first drain generating a first output voltage;

a second P-channel transistor having a second source connected to the operating voltage, a second gate generating a second output voltage and a second drain connected to the first drain;

a first N-channel transistor having a third drain connected to the second drain and a third gate connected to the second gate;

a second N-channel transistor having a fourth drain connected to a third source of the first N-channel transistor and a fourth gate defined as the first input terminal;

a third N-channel transistor having a fifth drain connected to the third source, a fifth gate connected to the third gate and a fifth source connected to a fourth source of the second N-channel transistor;

a third P-channel transistor having a sixth source connected to the operating voltage, a sixth gate receiving the enable signal and a sixth drain connected to the second gate;

a fourth P-channel transistor having a seventh source connected to the operating voltage, a seventh gate connected to the second drain and a seventh drain connected to the sixth drain and the second gate;

a fourth N-channel transistor having an eighth drain connected to the seventh drain and an eighth gate connected to the seventh gate;

a fifth N-channel transistor having a ninth drain connected to an eighth source of the fourth N-channel transistor and a ninth gate defined as the second input terminal;

a sixth N-channel transistor having a tenth drain connected to the ninth drain, a tenth gate connected to the eighth gate and a tenth source connected to a ninth source of the fifth N-channel transistor and the fifth source; and a seventh N-channel transistor having an eleventh drain connected to the tenth source, an eleventh gate receiving the enabled signal and a eleventh source connected to a ground.

33. A method of reading a NAND nonvolatile memory device having a NAND memory array, a reference NAND string and a plurality of sense amplifiers, the NAND memory array having a plurality of NAND strings arranged therein, each of the sense amplifiers having a first input terminal connected to both one of a plurality of first capacitors and a corresponding bit line and a second input terminal connected to both a second capacitor and a reference bit line, the method comprising the steps of:

applying a read pass voltage to a plurality of unselected word lines in at least one selected NAND string and the reference NAND string;

applying a read voltage to each first capacitor of each bit line and the second capacitor to pre-charge each bit line and the reference bit line to a preset voltage during a charge period;

applying a gate voltage to a selected word line to discharge the reference bit line and each bit line through a selected reference cell and each corresponding selected NVM cell during an elapsing period and a sensing period; and sensing a voltage difference between the selected reference bit line and the corresponding bit line by means of each of the sense amplifiers during the sensing period;

wherein capacitances of the first capacitors and the second capacitor are substantially equivalent.

34. The method according to claim 33, wherein the plurality of NAND strings forming the NAND memory array and the reference NAND string comprise the same type of NVM cells.

35. The method according to claim 33, wherein a result of sensing indicates whether a threshold voltage of a selected NVM cell of the corresponding bit line is greater than a threshold voltage of the selected reference cell of the reference bit line.

36. The method according to claim 33, wherein when a threshold voltage of a selected NVM cell of the corresponding bit line is greater than a threshold voltage of the selected reference cell, the second capacitor is discharged faster than the first capacitor of the corresponding bit line during the elapsing period and the sensing period.

37. The method according to claim 33, further comprising:

applying a biased voltage to the selected word line before applying the read voltage;

wherein a level of the biased voltage is able to turn off the selected reference cell and each corresponding selected NVM cell.

* * * * *